United States Patent
Chan et al.

(10) Patent No.: US 7,354,847 B2
(45) Date of Patent: Apr. 8, 2008

(54) METHOD OF TRIMMING TECHNOLOGY

(75) Inventors: Bor-Wen Chan, Hsin chu (TW);
Yi-Chun Huang, Pingjhen (TW);
Baw-Ching Perng, Hsin-Chu (TW);
Hun-Jan Tao, Hsin chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 325 days.

(21) Appl. No.: 10/764,913

(22) Filed: Jan. 26, 2004

(65) Prior Publication Data

US 2005/0164478 A1    Jul. 28, 2005

(51) Int. Cl.
*H01L 21/3205* (2006.01)
*H01L 27/10* (2006.01)

(52) U.S. Cl. ...................... 438/587; 257/202

(58) Field of Classification Search ............... 438/142, 438/176, 275, 587, 636, 952; 257/202, 245, 257/E27.121–E27.126
See application file for complete search history.

(56) References Cited

U.S. PATENT DOCUMENTS

| | | | |
|---|---|---|---|
| 6,482,726 B1 | 11/2002 | Aminpur et al. ............ | 438/585 |
| 6,492,068 B1 | 12/2002 | Suzuki ........................... | 430/5 |
| 6,500,755 B2 | 12/2002 | Dakshina-Murthy et al. ........................... | 438/637 |
| 6,541,360 B1 | 4/2003 | Plat et al. .................... | 438/585 |
| 6,548,423 B1 | 4/2003 | Plat et al. .................... | 438/780 |
| 7,122,455 B1* | 10/2006 | Lyons et al. ................. | 438/585 |
| 2002/0164543 A1 | 11/2002 | Lin et al. ..................... | 430/313 |
| 2004/0063261 A1* | 4/2004 | Takahashi .................... | 438/197 |
| 2005/0215039 A1* | 9/2005 | Hill et al. .................... | 438/585 |
| 2006/0063364 A1* | 3/2006 | Stephens et al. ............ | 438/585 |
| 2006/0172498 A1* | 8/2006 | Yamaguchi et al. ........ | 438/287 |
| 2006/0273415 A1* | 12/2006 | Kim ........................... | 257/413 |

\* cited by examiner

*Primary Examiner*—Calvin Lee
(74) *Attorney, Agent, or Firm*—Haynes Boone, LLP

(57) ABSTRACT

A process for trimming a photoresist layer during the fabrication of a gate electrode in a MOSFET is described. A bilayer stack with a top photoresist layer on a thicker organic underlayer is patternwise exposed with 193 nm or 157 nm radiation to form a feature having a width $w_1$ in the top layer. A pattern transfer through the underlayer is performed with an anisotropic etch based on $H_2/N_2$ and $SO_2$ chemistry. The feature formed in the bilayer stack is trimmed by 10 nm or more to a width $w_2$ by a $HBr/O_2/Cl_2$ plasma etch. The pattern transfer through an underlying gate layer is performed with a third etch based on $HBr/O_2/Cl_2$ chemistry. The underlayer is stripped by an $O_2$ ashing with no damage to the gate electrode. Excellent profile control of the gate electrode is achieved and a larger ($w_1-w_2$) is possible than in prior art methods.

37 Claims, 5 Drawing Sheets

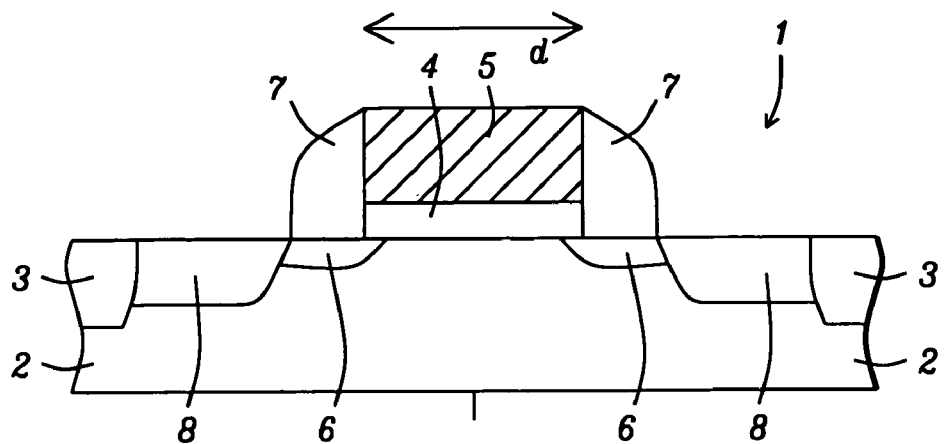
FIG. 1 – Prior Art
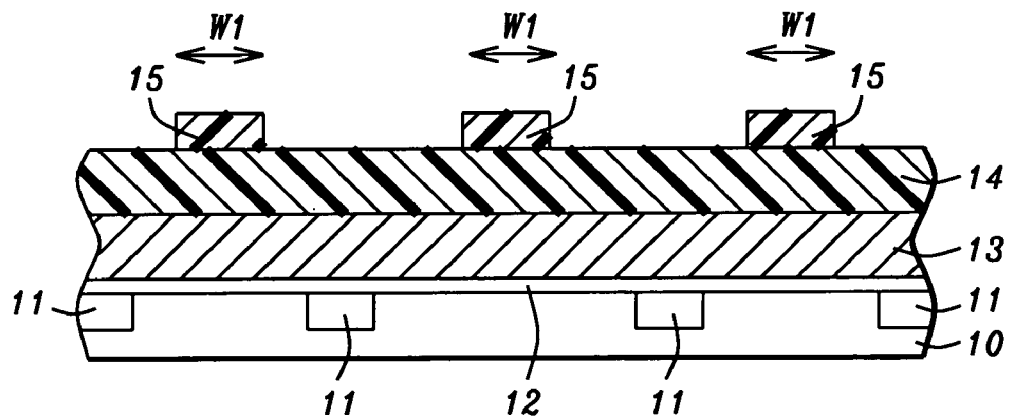
FIG. 2
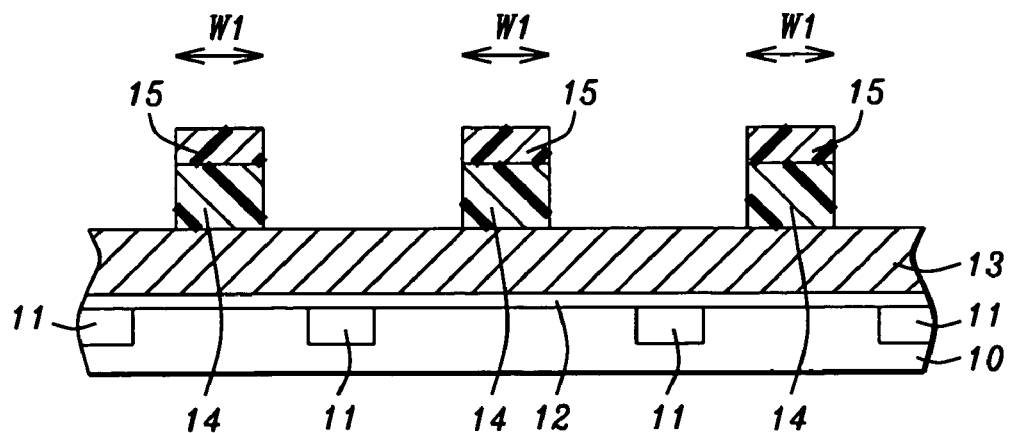
FIG. 3

METHOD OF TRIMMING TECHNOLOGY

FIELD OF THE INVENTION

The invention relates to a method of fabricating an integrated circuit in a microelectronic device. More particularly, the present invention is directed to a method of trimming an organic layer in order to reduce a critical dimension below a feature size that can be achieved by lithographic methods.

BACKGROUND OF THE INVENTION

One of the key steps in the manufacture of a Metal-Oxide-Semiconductor Field Effect Transistor (MOSFET) is formation of a gate electrode comprised of a conducing layer in which a gate length is typically one of the smallest dimensions in the device. To satisfy a constant demand for higher performance devices, the gate length is continually being reduced in each successive technology generation. For current technology, a gate length ($L_G$) as small as 60 or 70 nm is required and $L_G$ will continue to shrink as sub-100 nm technology nodes are implemented in manufacturing. One shortcoming of state of the art lithography processes is that they are incapable of controllably printing features such as a gate in a photoresist layer with a $L_G$ smaller than about 100 nm. To overcome this limitation, many semiconductor fabs use a trimming process which laterally shrinks a photoresist feature such as a line with a plasma etch step.

A conventional MOSFET 1 is pictured in FIG. 1 and is typically fabricated by first forming isolation regions 3 such as shallow trench isolation (STI) regions comprised of an insulating material in a substrate 2. A gate dielectric layer 4 is formed on the substrate 2 and a gate layer which may be doped or undoped polysilicon is deposited on the gate dielectric layer 4. After the gate layer is patterned by conventional means to form a gate electrode 5 having a gate length d, the gate layer pattern is etch transferred through the gate dielectric layer 4. Ion implantation is used to form shallow source/drain regions 6 and deep source/drain regions 8. Sidewall spacers 7 are added adjacent to the gate electrode 5 and gate dielectric layer 4. Subsequently, a silicide layer (not shown) may be formed over the gate electrode 5 and deep source/drain regions 8 and contacts (not shown) may be formed to the silicide layer.

The gate pattern which defines the gate length d is initially formed by patternwise exposing a photoresist layer (not shown) on the gate layer and developing with an aqueous base to selectively remove exposed or unexposed portions of the photoresist layer depending upon the tone of the photoresist. A positive tone photoresist undergoes a reaction in exposed regions that renders them soluble in an aqueous base developer solution while unexposed portions of the photoresist film remain insoluble in the developer. In a negative tone photoresist, exposed regions are typically crosslinked to become insoluble in a developer while the unexposed portions are washed away in the developer.

A photoresist may be applied as a single layer or as the top layer of a bilayer system. A single layer photoresist is usually coated over an anti-reflective coating (ARC) that helps to control a subsequent imaging process. In bilayer applications, a pattern is formed in a thin photoresist layer and is etch transferred through a thicker underlayer that is used for its planarization and anti-reflective properties.

In some cases, a single layer or bilayer photoresist is selected in which the photoresist (imaging) layer is very opaque to the incident exposing radiation such that only a top portion near the surface absorbs energy and undergoes a chemical change. Top surface imaging techniques are frequently combined with a silylation process which forms O—Si bonds selectively in either the exposed or unexposed regions. For example, a silicon containing gas may react with a phenol group in the polymer component of a photoresist layer to yield O—Si bonds. A subsequent plasma etch that includes oxygen chemistry removes portions of the photoresist that are not protected by the O—Si bonds and thereby produces a pattern without the need of a developer solution.

The lithography process that is used to pattern the photoresist above the gate layer generally involves exposure tools which use wavelengths that are selected from a range of about 450 nm (near UV) to approximately 13 nm for extreme UV (EUV) exposures. High throughput projection electron beam tools that have the capability of imaging 50 to 70 nm resist features may be used in manufacturing in the near future. Even with the most advanced exposures tools, phase shifted masks, and other resolution enhancement techniques, the minimum feature size that can be reliably printed in a photoresist layer is not small enough to meet the demand for sub-100 nm gate lengths for most new devices. As a result, the industry has resorted to other methods that involve trimming the photoresist pattern such as an isotropic plasma etch process.

A plasma etching process employs the use of a photoresist mask to selectively allow an etchant to remove an underlying layer that has been exposed through openings in the mask pattern. In an anisotropic etch, the etchant only removes the underlying layer uncovered by the photoresist pattern. On the other hand, an isotropic etch involves removing exposed portions of the underlying layer along with some of the photoresist along the sidewalls of the openings in the pattern. Ideally, the photoresist layer is not distorted during the etch and should retain a majority of its thickness in order to avoid the formation of edge roughness and sidewall striations that may be transferred into the underlying layer. However, the polymers in photoresists developed for 193 nm or 157 nm lithography applications in new technologies do not contain aromatic groups which have an inherently high absorbance below about 240 nm. Therefore, the 193 nm and 157 nm photoresists based on acrylate and cyclic olefin based polymers are not as robust during a plasma etch process as their DUV (248 nm) or i-line (365 nm) predecessors which contain aromatic groups for high etch resistance.

Additionally, as the exposure wavelength shrinks to print smaller features in a photoresist layer, the thickness of the photoresist must also decrease to maintain a good focus and exposure latitude. Generally, the height of a photoresist line should not be more than about four times its width in order to prevent a phenomenon called line collapse. Therefore, etching sub-100 nm features using a thin 193 nm or 157 nm based photoresist mask of about 3000 Angstroms or less that has minimal etch resistance is problematic for single layer imaging schemes. Not only does the 193 nm or 157 nm photoresist have a lower etch resistance than DUV or i-line photoresists, but a thinner etch mask is used than in conventional DUV or i-line applications. At best, the amount of trimming or CD reduction is limited to about 10 nm or less for 193 nm or 157 nm photoresist layers which does not satisfy the need for large scale trimming of about 30 nm or more in many technologies.

One concept that has been practiced to overcome photoresist etching issues is to etch a pattern in a photoresist layer into an underlying hard mask that has a much better selectivity towards the gate layer than the photoresist. Once the pattern is transferred, the photoresist layer is stripped and the hard mask serves as the template for the etch transfer step to define the gate length in the gate layer. However, this method also has drawbacks including a poor profile control of the hard mask and damage to the gate layer and a silicon substrate when a hardmask such as silicon nitride is removed by phosphoric acid, for example.

In U.S. Pat. No. 6,500,755, a photoresist is patterned and trimmed on an optional cap layer on a dielectric layer. The pattern is etched into the cap layer and the photoresist is removed. A hard mask is deposited on the cap layer and is planarized to leave a portion of the cap layer exposed. The exposed cap layer and underlying dielectric layer are selectively removed by an etch to generate openings above a substrate.

In U.S. Pat. No. 6,482,726, a photoresist layer is patterned and trimmed above a second hard mask layer. The pattern is anisotropically etched through the second hard mask which may be $SiO_2$. Once the photoresist layer is removed, a wet etch with $H_3PO_4$ isotropically transfers the pattern through an underlying first hard mask layer that is silicon nitride and laterally shrinks the first hard mask to a width less than that for the second hard mask. After the second hard mask is removed, the pattern is etched into a gate layer.

A multilayer anti-reflective coating (ARC) process is described in U.S. Pat. No. 6,548,423 in which a photoresist layer is patterned and trimmed above a second ARC which is silicon nitride or SiON. The pattern is anisotropically transferred through the second ARC and a first ARC which is CVD deposited carbon. The photoresist layer is stripped and the pattern is etched into an underlying gate layer using the ARCs as a combined hard mask.

An etching method is described in U.S. Pat. No. 6,492,068 in which a photoresist layer is patterned over a bottom ARC (BARC). The pattern is anisotropically etched through the BARC by a gas mixture including Ar, $O_2$, $Cl_2$, and HBr and is then transferred into an underlying gate layer with a $Cl_2$, $O_2$, and HBr plasma. The photoresist layer, BARC, and gate layer are trimmed simultaneously with an $O_2$ and HBr plasma etch.

A bilayer trim etch process is found in U.S. Pat. No. 6,541,360 where a photoresist layer is patterned above an organic layer. The pattern is isotropically etched with a plasma through the bottom organic layer so that the organic layer has sloped sidewalls and a top that is smaller than its bottom. After the top layer is removed, the pattern is etched into a gate layer to give a gate length that is smaller than the width of the initial photoresist feature. However, a reproducible gate length may be difficult since it depends on trimming a sloped sidewall in the bottom layer with a high degree of control.

In U.S. Patent Application Publication US2002/0164543A1, a bilayer photolithography process is described in which an imaging layer is patterned over an underlayer and the pattern is transferred through the underlayer with an $O_2$/HBr plasma process. The method prevents residue from forming on the sidewalls of the etched pattern that normally occurs with an $O_2/SO_2$ based plasma.

Thus, a new method of trimming a photoresist feature and transferring the resulting pattern into an underlying layer is needed that overcomes the limitations presented by a 157 nm or 193 nm single layer process, an isotropic etch, or a hard mask transfer step.

SUMMARY OF INVENTION

One objective of the present invention is to provide good gate profile control during a method to trim a gate layer to afford a gate length that is smaller than can be generated by a lithography method.

A further objective of the present invention is to provide a method of trimming a gate layer where the organic masking layer has sufficient thickness to allow large scale trimming and prevents sidewall striations from forming in the trimmed gate layer.

A still further objective of the present invention is to provide a method of trimming a gate layer that does not require a hard mask to be removed after the trimming step.

Yet another objective of the present invention is to provide a trimming method that is extendable to forming gate lengths below 100 nm.

These objectives are achieved by providing a substrate on which a gate dielectric layer and gate layer have been sequentially formed. A bilayer resist consisting of a lower non-photoimageable organic layer and a top photoresist layer is coated on the gate layer. The lower layer also referred to as the underlayer serves as an anti-reflective layer and is also thicker than the photoresist layer since the underlayer will function as an etch mask during a subsequent pattern transfer into the gate layer. The underlayer is formed by coating and baking a commercially available BARC, i-line photoresist, or DUV photoresist. When an i-line or DUV photoresist is employed as the underlayer, the underlayer is hard baked to destroy the photosensitive component and prevent interaction with the top photoresist layer. The top photoresist layer has a silicon-containing composition and is preferably a positive tone photoresist. The top photoresist layer is preferably patternwise exposed with 193 nm or 157 nm radiation to enable the lithography process to print sub-100 nm features. Optionally, the top photoresist layer is imaged with a shorter wavelength than 157 nm such as 13 nm radiation from an EUV source.

A key feature of the present invention is that the photoresist pattern is anisotropically transferred through the underlayer with a plasma etch process based on $N_2/H_2$ and $SO_2$ chemistry. It is important to achieve vertical sidewalls on the underlayer with no etch bias and no line collapse. Next, another crucial step is a trimming process that involves a plasma etch with $Cl_2$, HBr, and $O_2$ gases. The bilayer resist profile retains vertical sidewalls while the width of the feature is reduced considerably to a size that cannot be achieved by a lithography method. The pattern is then transferred through the underlying gate layer to produce a gate length that is equivalent to the width of the trimmed feature in the underlayer. The photoresist pattern is typically consumed during the gate etch and the underlayer may be removed in a following step by oxygen ashing which results in a patterned gate layer or gate electrode in a partially formed MOSFET.

In a second embodiment, a bilayer resist comprised of an upper photoresist layer on an underlayer is coated on a gate layer formed on a gate dielectric layer as in the first embodiment except that the photoresist layer does not contain silicon. The top photoresist layer is highly absorbing of the exposing wavelength so that a chemical reaction is induced only near the surface of exposed areas. The top surface imaging technique continues with a silylation procedure to selectively silylate regions of photoresist layer above portions of gate layer where a gate electrode is to be subsequently formed. In one embodiment, the exposed regions are silylated. Alternatively, the exposed regions are rendered inactive and the silylation occurs in unexposed regions of the top surface. Instead of a wet development to form a photoresist pattern as in the first embodiment, a plasma etch is performed to selectively remove portions of the photoresist that are not protected by silylated surface regions.

The remaining steps in the second embodiment including the anisotropic pattern transfer through the underlayer with $N_2/H_2$ and $SO_2$ chemistry and the trim etch with HBr, $Cl_2$ and $O_2$ gases are the same as described previously in the first embodiment.

BRIEF DESCRIPTION OF THE DRAWINGS

FIG. 1 is a cross-sectional view of a conventional MOSFET.

FIG. 2 is a cross-sectional view showing the patterning of a top layer in a bilayer resist formed on a gate layer according to one embodiment of the present invention.

FIG. 3 is a cross-sectional view of the structure in FIG. 2 after the pattern is anisotropically etch transferred through the bottom layer (underlayer) of the bilayer resist.

DETAILED DESCRIPTION OF THE INVENTION

Figure 4:
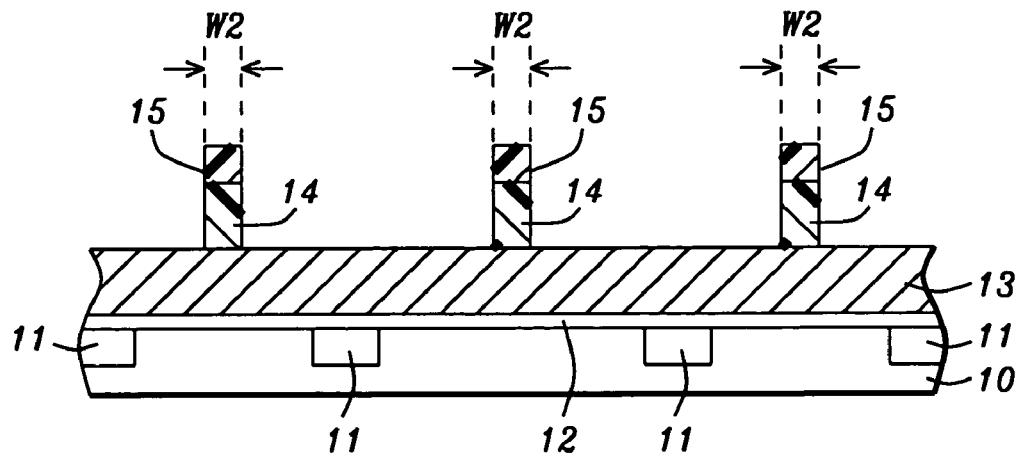
FIG. 4 is a cross-sectional view of the structure in FIG. 3 after the pattern is trimmed by a plasma etch process according to the present invention.

The present invention is a method that involves a plasma etch process to reduce the width of a feature in a photoresist pattern in a controlled manner and is particularly useful during the formation of a gate electrode having a gate length that is substantially smaller than can be achieved by a lithography process. Those skilled in the art will appreciate that the invention is not limited to the specific examples described herein and may be applied to trimming photoresist features in other applications. Furthermore, the relative sizes of the various elements shown in the drawings may be different than those in an actual device.

The first embodiment is depicted in FIGS. 2-6. Referring to FIG. 2, a substrate 10 is provided which is typically monocrystalline silicon but may be alternatively be based on silicon-germanium, silicon-on-insulator, or other semiconductor materials used in the art. Additionally, substrate 10 may be comprised of active and passive devices that are not shown in order to simplify the drawing. Isolation regions 11 which in the exemplary embodiment are STI regions are formed in the substrate 10 by conventional means and typically contain an insulating layer such as $SiO_2$ or a low k dielectric material. Between adjacent isolation regions 11 is a p-well or an n-well (not shown) depending on whether a NMOS or a PMOS transistor is to be formed on an overlying active area.

A gate stack that includes a gate layer 13 on a gate dielectric layer 12 is formed on the substrate 10. First, a gate dielectric layer 12 with a thickness of about 5 to 100 Angstroms is formed on the substrate 10 by an oxidation method, a chemical vapor deposition (CVD), or by a plasma enhanced CVD (PECVD) technique. In one embodiment, the gate dielectric layer 12 is silicon oxide. Alternatively, the gate dielectric layer 12 may include a high k dielectric layer comprised of one or more of $ZrO_2$, $HfO_2$, $TiO_2$, $Ta_2O_5$, $Al_2O_3$, $Y_2O_3$, and $La_2O_3$ or a silicate, one or more of Zr, Hf, Ti, Ta, Al, Y, and La formed on a thin interfacial layer that is silicon nitride, silicon oxide, or silicon oxynitride. High k dielectric layers are formed by a CVD, metal organic CVD (MOCVD), or an atomic layer deposition (ALD) process.

In one embodiment, a gate layer 13 that is doped or undoped polysilicon is deposited by a CVD or PECVD method on the gate dielectric layer 12 and has a thickness between about 500 and 5000 Angstroms. Optionally, the gate layer 13 may be comprised of amorphous silicon, SiGe, or SiGeC.

Next, a bilayer stack comprised of a top photoresist layer 15 and an organic underlayer hereafter referred to as underlayer 14 is formed on the gate layer 13. An underlayer solution that is typically comprised of an organic polymer is commercially available. One source is Arch Chemicals, Inc. of E. Providence, R.I. The underlayer solution is spin coated and then baked at a temperature of up to 230° C. to remove organic solvent and form an underlayer 14 that is inactive toward a subsequently coated photoresist layer 15. Optionally, a commercially available i-line photoresist or Deep UV (DUV) photoresist is spin coated on the gate layer 13 and is baked at a temperature up to about 230° C. to remove organic solvents and to render the photosensitive components inactive. The resulting underlayer 14 has a thickness from about 1000 to 10000 Angstroms and is preferably thicker than the photoresist layer 15 in order to prevent edge roughness and striations in the photoresist pattern from being etch transferred into the gate layer in a later pattern transfer step. The underlayer 14 typically forms a crosslinked polymer network upon heating and is used to control reflectivity during a subsequent lithographic step in which a pattern is printed in the photoresist layer 15. Therefore, an underlayer 14 is preferably selected that has a refractive index (n and k values) which minimizes reflectivity of the exposing radiation (not shown) off the underlayer and gate layer 13 into the photoresist layer 15.

The photoresist layer 15 may have either a positive or a negative tone composition but is preferably a positive tone photoresist that contains silicon and has a thickness between about 100 to 3000 Angstroms. A silicon containing photoresist layer 15 is employed to provide a high selectivity of the etchant to the thicker underlayer 14 during the etch transfer of the resulting photoresist pattern through the underlayer in a subsequent step. In other words, there should be a minimal thickness loss in the photoresist pattern 15 during a pattern transfer through the underlayer 14. Preferably, the photoresist layer is patternwise exposed with 193 nm or 157 nm radiation and is developed in an aqueous base solution to generate a photoresist pattern 15 with features (lines) having a width $w_1$. Note that the photoresist pattern 15 is aligned so that a line formed therein is centered approximately midway between the isolation regions 11. A 193 nm or 157 nm exposure wavelength is necessary to print lines where $w_1$ is sub-100 nm for advanced technologies. Optionally, a shorter wavelength such as 13 nm radiation from an EUV source or a projection electron beam system may be used to generate a $w_1$ of less than 100 nm. It should be understood that the present invention also applies to printing and trimming feature sizes greater than 100 nm. However, the requirement for a controllable etch process is more demanding as $w_1$ shrinks and the present invention is more beneficial for sub-100 nm applications where prior art methods are limited.

Referring to FIG. 3, a key feature of the present invention is the pattern transfer step through the underlayer 14. A first plasma etch step is selected for a pattern transfer that maintains vertical sidewalls on the features in the photoresist pattern 15 and forms vertical sidewalls on etched portions of the underlayer 14. Alternatively, the etched underlayer 14 has sidewalls with a retrograde profile in which the top of the underlayer has a width $w_1$ and the bottom has a width slightly less than $w_1$. The etch conditions employed represent an anisotropic process in which feature size $w_1$ is maintained in the photoresist pattern 15 and is reproduced at least in the top portion of the underlayer 14. The inventors have discovered that an etch chemistry based on $H_2$, $N_2$, and $SO_2$ provides the required results. In a preferred embodiment, the substrate 10 with the photoresist pattern 15 on unpatterned underlayer 14 is loaded into a process chamber. The underlayer 14 is etched with the following process conditions: a 10 to 500 standard cubic centimeter per minute (sccm) flow rate of $H_2$, a 10 to 500 sccm $N_2$ flow rate, a 10 to 500 sccm $SO_2$ flow rate, a chamber temperature of about 0° C. to 100° C., a RF power from about 100 to 1000 Watts, and a chamber pressure between about 3 mTorr and 500 mTorr. The underlayer 14 is removed at a rate of about 2000 Angstroms/minute. Etch rate selectivity of the underlayer 14 to the photoresist pattern 15 is about 5:1.

Referring to FIG. 4, another critical step in the method of the first embodiment is a trimming process in which the feature size $w_1$ in the photoresist pattern 15 and underlayer 14 is reduced to $w_2$ where $(w_1-w_2)$ may be 10 nm or more. It is important to maintain vertical sidewalls on the underlayer 14 with minimal roughness so that sidewall striations are not produced in the gate layer 13 in a subsequent pattern transfer step. A second plasma etch step that includes HBr, $O_2$, and $Cl_2$ is performed for the trimming process. In one embodiment, the second plasma step is performed in the same process chamber as the first plasma etch step. Optionally, the second plasma etch is performed in a different process chamber within the same mainframe (process tool) used for the first plasma etch.

The second plasma etch for trimming the feature size from $w_1$ to $w_2$ in the photoresist pattern 15 and underlayer 14 comprises the following conditions: a 10 to 500 sccm $Cl_2$ flow rate, a 1 to 50 sccm $O_2$ flow rate, a 10 to 500 sccm HBr flow rate, a chamber temperature of about 0° C. to 100° C., a RF power from about 100 to 1000 Watts, and a chamber pressure between about 3 and 500 mTorr for a period of about 5 to 200 seconds. Under these conditions, the trimming rate to reduce $w_1$ to $w_2$ is about 30 Angstroms per minute.

Figure 5:
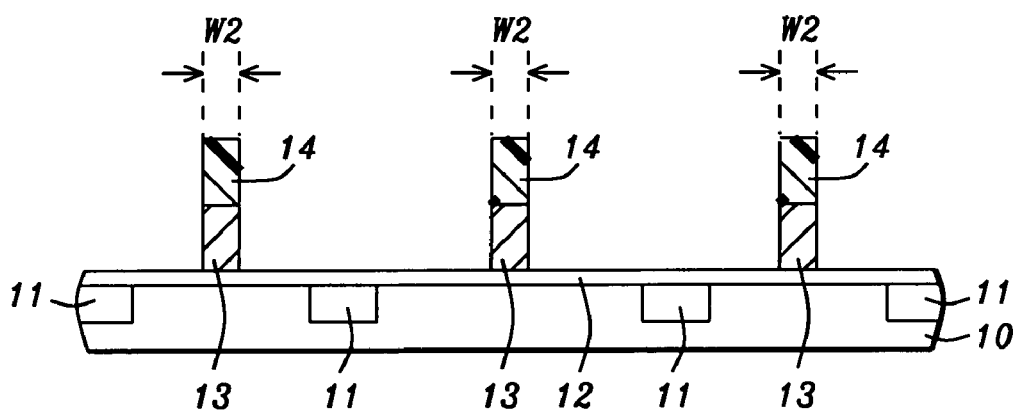
FIG. 5 is a cross-sectional view of the structure in FIG. 4 after the top photoresist layer is removed and the pattern is anisotropically etched through the gate layer.

Referring to FIG. 5, the pattern with features having a width $w_2$ in the underlayer 14 is now transferred through the gate layer 13. Note that the photoresist pattern 15 may be removed during the second plasma etch step. Optionally, the photoresist pattern 15 is removed during a third plasma etch step which follows. A third plasma etch step involving an anisotropic etch process is preferred so that vertical sidewalls are formed in the etched gate layer 13 hereafter referred to as gate electrode 13 and in order to form a gate length $w_2$ with excellent process control. When the gate layer 13 is polysilicon, an exemplary process for generating a gate length $w_2$ is a $Cl_2$ flow rate of from 10 to 500 sccm, a HBr flow rate of 10 to 500 sccm, an $O_2$ flow rate of about 1 to 10 sccm, a chamber temperature from about 0° C. to 100° C., a RF power of about 100 to 1000 Watts, and a chamber pressure from about 3 to 500 mTorr. Under these conditions, the photoresist pattern 15 is typically consumed. A small top portion of the underlayer 14 may be consumed but a sufficient thickness of the underlayer 14 remains to serve as a stable etch mask during the third plasma etch through the gate layer 13. The third plasma etch is preferably done in the same process chamber as the second plasma etch step. Optionally, the third plasma etch and second plasma etches are performed in different process chambers within the same process tool.

Figure 6:
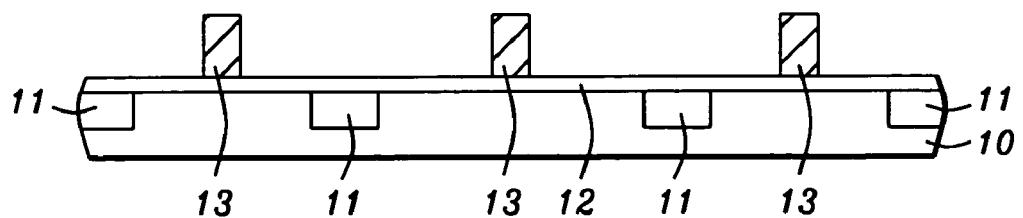
FIG. 6 is a cross-sectional view of the structure in FIG. 5 after the underlayer is removed by an oxygen ashing step according to the present invention.

Referring to FIG. 6, the underlayer 14 is removed by an oxygen ashing step known to those skilled in the art. As a result, a gate electrode 13 with a gate length $w_2$ of less than 100 nm is generated with excellent process control. This process is an advantage over a single layer photoresist mask which easily erodes during pattern transfer and yields poor quality profiles with a small process latitude. A larger trim $(w_1-w_2)$ is possible with the present invention than in prior art because of improved profile control, especially for sub-100 nm gate lengths. Likewise, the method of the first embodiment offers better profile control than gate fabrication schemes that involve a hard mask. Since the present invention does not rely on a hard mask, damage to the gate electrode or gate dielectric layer associated with a hard mask removal step is avoided. The thick underlayer that serves as a mask during the pattern transfer into the gate layer is an advantage over thinner etch masks since edge roughness in the photoresist layer is prevented from being transferred into the gate layer.

Figure 7:
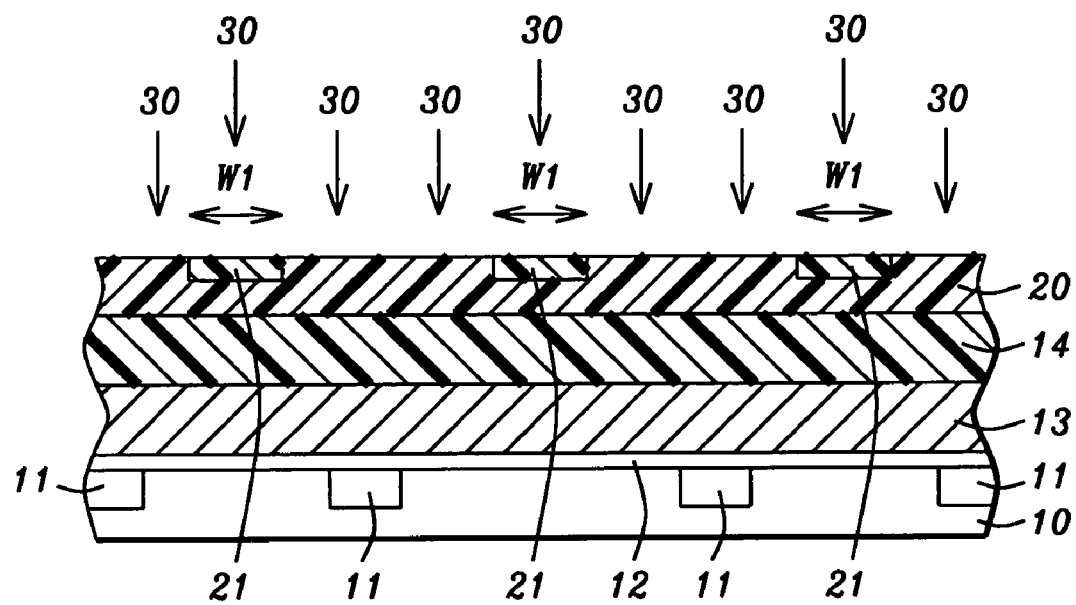
FIG. 7 is a cross-sectional view of a bilayer resist in which portions of the top photoresist layer are silylated in exposed surface regions according to a second embodiment of the present invention.
Figure 8:
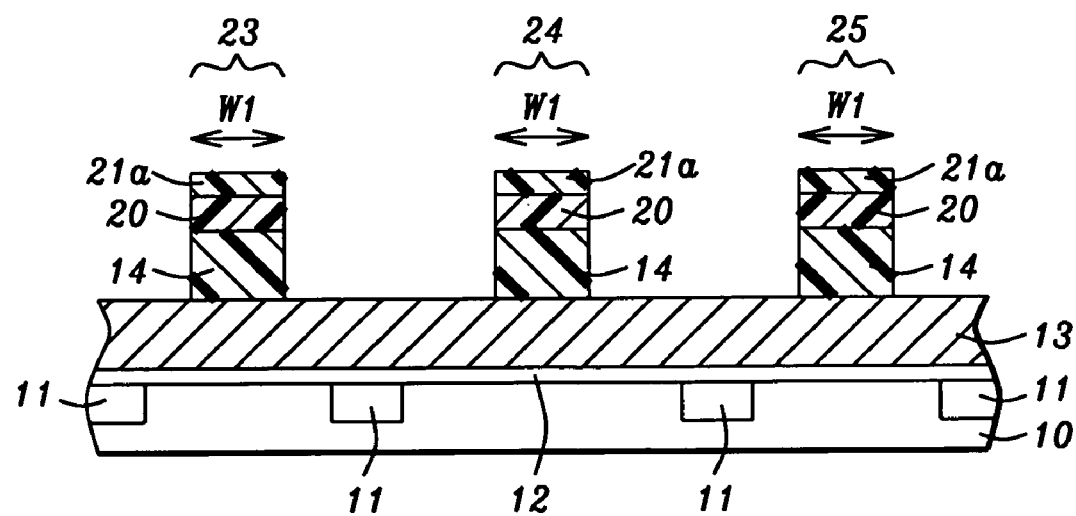
FIG. 8 is a cross-sectional view of the bilayer resist in FIG. 7 that has been etched to remove non-silylated surface regions and underlying portions of the top photoresist layer and underlayer to form a pattern having a first width.

A second embodiment is illustrated in FIGS. 7-8. Referring to FIG. 7, a partially formed transistor that includes a substrate 10 with isolation regions 11, a gate dielectric layer 12, a gate layer 13, and an underlayer 14 is formed as described previously. A top photoresist layer 20 is coated to a thickness of about 500 to 5000 Angstroms. The photoresist layer 20 and underlayer 14 form a bilayer stack. The photoresist layer 20 is preferably a positive tone non-silicon containing photoresist which highly absorbs 157 nm or 193 nm radiation so that during a typical patternwise exposure, only a small portion of the photoresist layer near the surface of an exposed region undergoes a photoinduced reaction. It is understood that a post-exposure bake may be necessary to increase the rate of the photoinduced reaction in order to decrease process time. Alternatively, a shorter wavelength than 157 nm may be used such as a 13 nm wavelength from an EUV source to patternwise expose the photoresist layer 20. A wavelength of less than 200 nm is preferred to enable the photoresist layer 20 to be selectively exposed in surface regions 21 having a width $w_1$ of below 100 nm. In an alternative embodiment, a longer exposure wavelength than 200 nm may be used if a width $w_1$ of about 130 nm or larger is desired.

The exposure chemically alters the regions 21 of the photoresist layer 20 so that the regions 21 may be selectively silylated by a conventional method known to those skilled in the art. Therefore, the photoresist layer 20 should not have any polar functionality such as alcohol groups that can be silylated. Both gas phase and liquid phase silylations are practiced in the art but in the exemplary embodiment a gas phase treatment 30 is preferably employed to silylate the regions 21. In one embodiment, the regions 21 are comprised of hydroxyl groups which react with a silicon-containing reagent during the gas treatment 30 to form O—Si bonds. Optionally, the gas treatment 30 is performed in which a silylating reagent reacts with polar functionalities other than hydroxyl groups to incorporate silicon in regions 21. In another embodiment, an organometallic reagent may be used in place of a silicon containing reagent to react with the regions 21 in the gas treatment 30 to forms regions 21a which have a high resistance to an etch chemistry based on $N_2/H_2$ and $SO_2$.

Referring to FIG. 8, the resulting silylated regions 21a have a higher resistance to an oxygen based etch chemistry than the photoresist layer 20 and underlayer 14. Therefore, following exposure and the gas treatment 30, a pattern comprised of lines 23, 24, 25 may be developed by a first plasma etch step that includes an oxygen containing gas. For example, the first plasma etch step involving $N_2/H_2$ and $SO_2$ described in the first embodiment may be performed here to form lines 23, 24, 25 comprised of a silylated region 21a having a width $w_1$ and an underlying portion of the photoresist layer 20 and underlayer 14.

In another embodiment, a pattern comprised of the lines 23, 24, 25 is formed by performing a first etch step with an oxygen based etch process such as one including $O_2$ and Ar, for example. Lines 23, 24, 25 with a feature size $w_1$ are generated which include a silylated region 21a and an underlying portion of the photoresist layer 20. The photoresist layer 20 that is not protected by an overlying silylated region 21a is removed during the etch process. This development process stops on the underlayer 14. Next, a second plasma etch step involving a 10 to 500 sccm flow rate of $H_2$, a 10 to 500 sccm $N_2$ flow rate, a 10 to 500 sccm $SO_2$ flow rate, a chamber temperature of about 0° C. to 100° C., a RF power from about 100 to 1000 Watts, and a chamber pressure between about 3 mTorr and 500 mTorr may be used to transfer the pattern through the underlayer 14. The etch process through the photoresist layer 20 and underlayer 14 results in lines 23, 24, 25 that have straight sidewalls and a width $w_1$ which is a key step of this embodiment. Alternatively, the underlayer 14 has sidewalls with a retrograde profile in which the top of the underlayer has a width $w_1$ and the bottom has a width slightly less than $w_1$. The first and second plasma etch steps may be performed in the same process chamber. It is understood that the resulting pattern may include other features (not shown) besides the lines 23, 24, 25 as appreciated by those skilled in the art.

Figure 9:
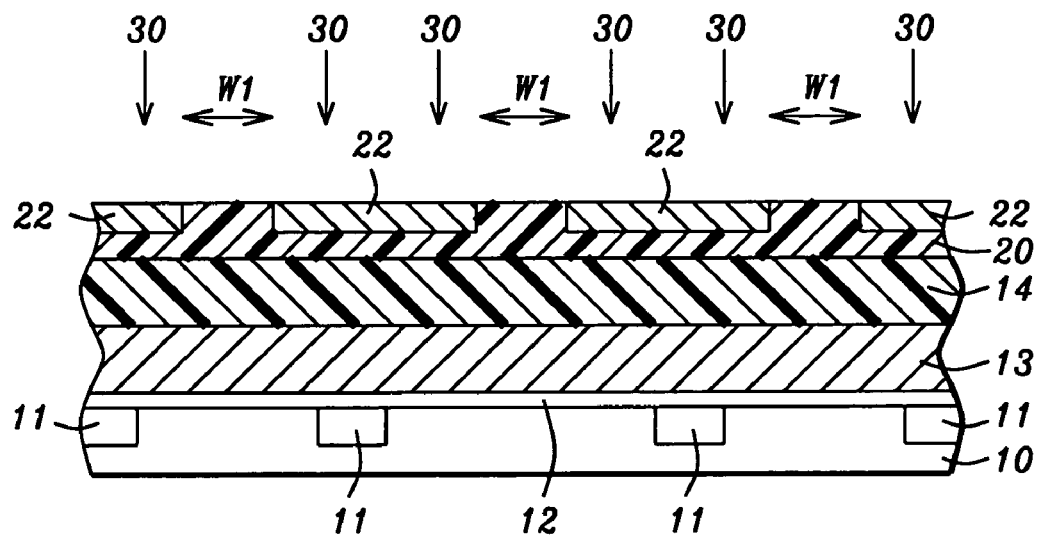
FIG. 9 is a cross-sectional view of a bilayer resist in which portions of the top photoresist layer are silylated in unexposed surface regions according to another embodiment of the present invention.

Referring to FIG. 9, an alternative embodiment for forming a silylated region 21a involves a photoresist layer 20 that is highly absorbing of 157 nm or 193 nm wavelengths and has a polar functionality that can react with a silylation agent or organometallic reagent to form etch resistant regions. The photoresist 20 is exposed by 157 nm or 193 nm radiation in surface regions 22 to induce a chemical reaction that renders the exposed surface regions inert toward a silylation or organometallic reagent. The width between the adjacent surface regions 22 is $w_1$. Then a gas treatment 30 as described previously is carried out to selectively silylate the photoresist layer 20 between the surface regions 22. Alternatively, an organometallic reagent may be used in place of a silylating reagent in the gas treatment 30.

Figure 10:
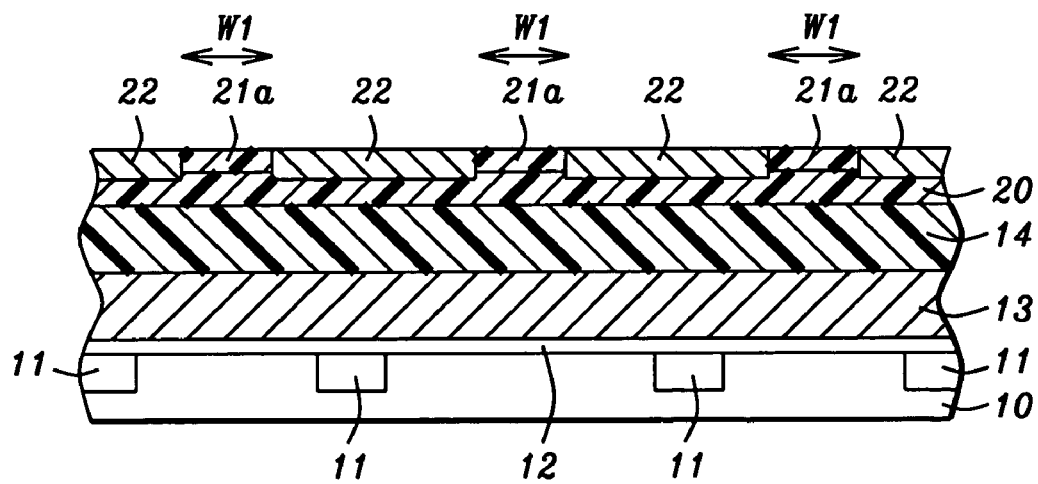
FIG. 10 is a cross-sectional view that shows silylated surface regions formed between exposed surface regions as a result of the silylation in FIG. 9.

Referring to FIG. 10, the thickness of the resulting silylated regions 21a is preferably less than the thickness of the surface regions 22 in order to prevent diffusion of the silylation reagent into the photoresist layer 20 below the surface regions 22. Note that a silylated region 21a is preferably aligned over the center of an underlying active area between isolation regions 11.

Referring again to FIG. 8, pattern comprised of the lines 23, 24, 25 having a width $w_1$ and comprised of a silylated region 21a and underlying portions of photoresist layer 20 and underlayer 14 is formed by either a first plasma etch step comprised of $N_2/H_2/SO_2$ as described previously or a first plasma etch step with an oxygen based plasma to etch through the surface regions 22 and underlying photoresist layer 20 and then a second plasma etch step with $N_2/H_2/SO_2$ to etch through exposed underlayer 14.

Figure 11:
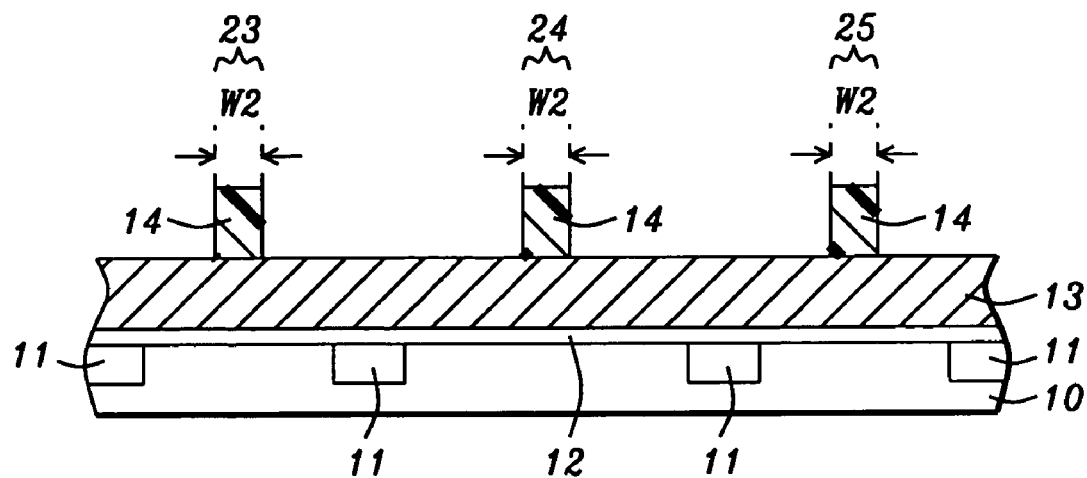
FIG. 11 is a cross-sectional view of the pattern in FIG. 8 that has been trimmed by a plasma etch process of the present invention to form a feature having a second width.

Referring to FIG. 11, another critical step in the method of the second embodiment is now executed and is a trimming process in which the feature size $w_1$ is reduced to $w_2$ where $(w_1-w_2)$ may be 10 nm or more. It is important to maintain vertical sidewalls on the underlayer 14 with minimal roughness so that sidewall striations are not produced in the gate layer 13 in a subsequent pattern transfer step. A plasma etch step that is based on HBr, $O_2$, and $Cl_2$ chemistry as described in the first embodiment is performed for the trimming process. In one embodiment, the plasma etch with HBr, $O_2$ and $Cl_2$ is performed in the same process chamber as the $H_2/N_2/SO_2$ plasma etch step. Optionally, the $HBr/O_2/Cl_2$ plasma etch and the $H_2/N_2/SO_2$ plasma etch are performed in two different process chambers within the same mainframe (process tool). Note that the silylated regions 21 and underlying photoresist layer 20 may be removed during the trimming process. Optionally, the silylated regions 21a and the photoresist layer 20 are removed during a gate layer etch step which follows.

The underlayer 14 is used as an etch mask in the next plasma etch step to transfer the lines 23, 24, 25 having a width $w_2$ through the gate layer 13. An anisotropic etch process is preferred so that vertical sidewalls are formed in the etched gate layer (gate electrode) 13 and in order to form a gate length $w_2$ with excellent process control. When the gate layer 13 is polysilicon, an exemplary process for generating a gate length $w_2$ is a $Cl_2$ flow rate of from 10 to 500 sccm, a HBr flow rate of 10 to 500 sccm, an $O_2$ flow rate of about 1 to 10 sccm, a chamber temperature from about 0° C. to 100° C., a RF power of about 100 to 1000 Watts, and a chamber pressure from about 3 to 500 mTorr. Under these conditions, the silylated layer 21a and underlying photoresist layer 20 are typically consumed and are completely removed. A small top portion of the underlayer 14 may be consumed but a sufficient thickness of the underlayer 14 remains to serve as a stable etch mask during the plasma etch through the gate layer 13.

Figure 12:
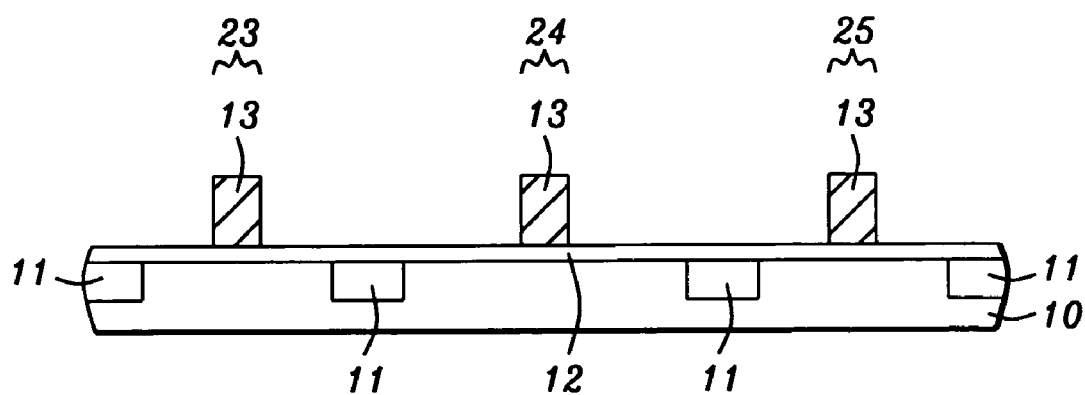
FIG. 12 is a cross-sectional view of the structure in FIG. 11 after the pattern is etched through the gate layer to form a gate electrode and the bottom layer of the bilayer resist is removed according to the present invention

Referring to FIG. 12, the underlayer 14 is removed by an oxygen ashing step to afford a partially formed transistor with a gate electrode 13. As a result, a gate electrode 13 having a gate length $w_2$ of less than 100 nm is generated with excellent process control. The benefits of the second embodiment are the same as described previously for the first embodiment and encompass improved profile control on the etch mask and resulting gate electrode, a larger trim amount ($w_1-w_2$) than achieved previously, and the avoidance of damage to the gate layer and gate dielectric layer by omitting a hard mask. Furthermore, the thick underlayer that serves as a mask during the pattern transfer into the gate layer is an advantage over thinner etch masks since edge roughness in the photoresist layer is prevented from being transferred into the gate electrode.

While this invention has been particularly shown and described with reference to, the preferred embodiments thereof, it will be understood by those skilled in the art that various changes in form and details may be made without departing from the spirit and scope of this invention.

We claim:

1. A method of trimming a feature in a pattern formed in a photoresist layer on a substrate, comprising:
   providing a substrate;
   forming a bilayer stack comprised of a top photoresist layer and an organic underlayer on said substrate, said organic underlayer is thicker than said top photoresist layer;
   forming a pattern having a feature with a first width in said top photoresist layer;
   transferring said pattern through the organic underlayer with a first plasma etch step to produce a pattern that has a feature with a first width and sidewalls; and
   trimming said pattern with a second plasma etch step to give a pattern in the bilayer stack having a feature with a second width and sidewalls, said second width is smaller than said first width.

2. The method of claim 1 wherein the top photoresist layer is a silicon containing positive tone photoresist that is patterned by exposing with 193 nm, 157 nm, or EUV radiation and developing in an aqueous base solution.

3. The method of claim 1 wherein the organic underlayer has a thickness of about 1000 to 10000 Angstroms and does not react with the top photoresist layer during the photoresist coating and patterning steps.

4. The method of claim 1 wherein said first width in said top photoresist layer is less than 100 nm.

5. The method of claim 1 wherein the first plasma etch step comprises the following conditions: a 10 to 500 standard cubic centimeter per minute (sccm) flow rate of H2; a 10 to 500 sccm flow rate of N2; a 10 to 500 sccm flow rate of SO2; a chamber temperature of about 0° C. to 100° C.; a RF power from about 100 to 1000 Watts; and a chamber pressure between about 3 and 500 mTorr.

6. The method of claim 1 wherein the second plasma etch step comprises the following conditions: a 10 to 500 sccm Cl2 flow rate; a 1 to 50 sccm O2 flow rate; a 10 to 50 sccm HBr flow rate; a chamber temperature of about 0° C. to 100° C.; a RF power from about 100 to 1000 Watts; and a chamber pressure between about 3 and 500 mTorr for a period of about 5 to 200 seconds.

7. The method of claim 1 wherein the first and second plasma etch steps are performed in the same process chamber.

8. The method of claim 1 wherein the second width is more than about 10 nm smaller than the first width.

9. The method of claim 1 further comprised of transferring the pattern into said substrate with a third plasma etch step in the same process chamber as used for the second plasma etch step.

10. The method of claim 1 wherein the sidewalls formed on the organic underlayer portion of said feature are vertical or have a retrograde profile.

11. The method of claim 1 wherein the substrate includes isolation regions formed therein and a gate stack comprised of a gate layer on a gate dielectric layer formed on said substrate between said isolation regions.

12. The method of claim 11 further comprising:
   selectively silylating portions of the top photoresist layer to give silylated portions having the first width; and
   wherein the step of forming a pattern includes removing non-silylated portions in the surface region and the underlying top photoresist layer.

13. A method of forming a gate electrode in a MOSFET, comprising:
   providing a substrate with isolation regions formed therein and with a gate stack comprised of a gate layer on a gate dielectric layer formed on said substrate between said isolation regions;
   forming a bilayer stack comprised of a top photoresist layer and an organic underlayer on said gate layer, said organic underlayer is thicker than said top photoresist layer;
   forming a pattern having a feature with a first width in said top photoresist layer;
   transferring said pattern through the organic underlayer with a first plasma etch step to produce a pattern that has a feature with a first width and sidewalls;
   trimming said pattern in said top photoresist and organic underlayer with a second plasma etch step to give a pattern in the bilayer stack having a feature with a second width and sidewalls, said second width is smaller than said first width; and
   transferring said trimmed pattern with said second width through said gate layer with a third plasma etch step to form a gate electrode.

14. The method of claim 13 wherein the gate layer is polysilicon with a thickness between about 500 and 5000 Angstroms.

15. The method of claim 13 wherein the top photoresist is a silicon containing positive tone photoresist that is patterned by exposing with 193 nm, 157 nm, or EUV radiation and developing in an aqueous base solution.

16. The method of claim 13 wherein the organic underlayer has a thickness of about 1000 to 10000 Angstroms and does not react with the top photoresist layer during the photoresist coating and patterning steps.

17. The method of claim 13 wherein said first width in said top photoresist layer is less than about 100 nm.

18. The method of claim 13 wherein the first plasma etch step comprises a 10 to 500 sccm flow rate of H2, a 10 to 500 sccm flow rate of N2, a 10 to 500 sccm flow rate of SO2, a chamber temperature of about 0° C. to 100° C., a RF power from about 100 to 1000 Watts, and a chamber pressure between about 3 and 500 mTorr.

19. The method of claim 13 wherein the second plasma etch step comprises a 10 to 500 sccm Cl2 flow rate, a 1 to 50 sccm O2 flow rate, a 10 to 50 sccm HBr flow rate, a chamber temperature of about 0° C. to 100° C., a RF power from about 100 to 1000 Watts, and a chamber pressure between about 3 and 500 mTorr for a period of about 5 to 200 seconds.

20. The method of claim 13 wherein the second width is more than about 10 nm smaller than the first width.

21. The method of claim 13 wherein the sidewalls formed on the organic underlayer portion of said feature are vertical or have a retrograde profile.

22. The method of claim 13 wherein the third plasma etch step comprises a 10 to 500 sccm flow rate of Cl2, a 10 to 500 sccm flow rate of HBr, a 1 to 10 sccm flow rate of O2, a chamber temperature of about 0° C. to 100° C., a RF power from about 100 to 1000 Watts, and a chamber pressure between about 3 and 500 mTorr.

23. The method of claim 13 wherein the third plasma etch step is performed in the same process chamber as the second plasma etch step and removes the top photoresist layer.

24. The method of claim 23 further comprised of removing the underlayer after the third plasma etch step by an oxygen ashing process.

25. A method of forming a gate electrode in a MOSFET, comprising:
providing a substrate with isolation regions formed therein and with a gate stack comprised of a gate layer on a gate dielectric layer formed on said substrate between said isolation regions;
forming a bilayer stack comprised of a top photoresist layer with a surface region and an organic underlayer on said gate layer, said organic underlayer is thicker than said top photoresist layer;
patternwise exposing a surface region of the top photoresist layer;
selectively silylating portions of the top photoresist layer to give silylated portions having a first width;
forming a pattern having a feature with a first width in said top photoresist layer by a first plasma etch step that removes non-silylated portions in the surface region and the underlying top photoresist layer;
transferring said pattern through the organic underlayer with a second plasma etch step, said pattern has a feature with sidewalls and a first width;
trimming said pattern in said top photoresist layer and organic underlayer with a third plasma etch step to give a pattern in the bilayer stack having a feature with sidewalls and a second width, said second width is smaller than said first width;
transferring said trimmed pattern with said second width through said gatelayer with a fourth plasma etch step to form a gate electrode having a second width.

26. The method of claim 25 wherein the gate layer is polysilicon with a thickness between about 500 and 5000 Angstroms.

27. The method of claim 25 wherein the top photoresist is patternwise exposed with 193 nm, 157 nm, or EUV (13 nm) wavelengths that chemically alter only the exposed surface region of said top photoresist.

28. The method of claim 25 wherein the underlayer has a thickness of about 1000 to 10000 Angstroms and does not react with the photoresist layer during the photoresist coating and patterning steps.

29. The method of claim 25 wherein the first plasma etch comprises an oxygen containing plasma.

30. The method of claim 25 wherein the second plasma etch step comprises a 10 to 500 sccm flow rate of H2, a 10 to 500 sccm flow rate of N2, a 10 to 500 sccm flow rate of SO2, a chamber temperature of about 0° C. to 100° C., a RF power from about 100 to 1000 Watts, and a chamber pressure between about 3 and 500 mTorr.

31. The method of claim 25 wherein the third plasma etch step comprises a 10 to 500 sccm Cl2 flow rate, a 1 to 50 sccm O2 flow rate, a 10 to 50 sccm HBr flow rate, a chamber temperature of about 0° C. to 100° C., a RF power from about 100 to 1000 Watts, and a chamber pressure between about 3 and 500 mTorr for a period of about 5 to 200 seconds.

32. The method of claim 25 wherein the second width is more than about 10 nm smaller than the first width.

33. The method of claim 25 wherein the fourth plasma etch step is performed in the same chamber as the third plasma etch step and removes the top photoresist layer.

34. The method of claim 25 wherein the fourth plasma etch step comprises a 10 to 500 sccm flow rate of Cl2, a 10 to 500 sccm flow rate of HBr, a 1 to 10 sccm flow rate of O2, a chamber temperature of about 0° C. to 100° C., a RF power from about 100 to 1000 Watts, and a chamber pressure between about 3 and 500 mTorr.

35. The method of claim 25 further comprised of removing the underlayer after the fourth plasma etch step by an oxygen ashing process.

36. The method of claim 25 wherein said exposed surface regions of the top photoresist layer are selectively silylated.

37. The method of claim 25 wherein portions of the top photoresist layer between said exposed surface regions are selectively silylated.

* * * * *